US010079467B2

(12) United States Patent
Guzman et al.

(10) Patent No.: US 10,079,467 B2
(45) Date of Patent: Sep. 18, 2018

(54) OPTOMECHANICAL LASER FOR DYNAMIC MEASUREMENT

(71) Applicant: The United States of America, as Represented by the Secretary of Commerce, Washington, DC (US)

(72) Inventors: Felipe Guzman, Derwood, MD (US); Jacob M. Taylor, Washington, DC (US); Jon R. Pratt, Clarksburg, MD (US)

(73) Assignees: THE UNITED STATES OF AMERICA, AS REPRESENTED BY THE SECRETARY OF COMMERCE, Washington, DC (US); UNIVERSITY OF MARYLAND, College Park, MD (US)

( * ) Notice: Subject to any disclaimer, the term of this patent is extended or adjusted under 35 U.S.C. 154(b) by 0 days.

(21) Appl. No.: 15/634,563

(22) Filed: Jun. 27, 2017

(65) Prior Publication Data

US 2017/0373462 A1    Dec. 28, 2017

Related U.S. Application Data

(60) Provisional application No. 62/355,215, filed on Jun. 27, 2016.

(51) Int. Cl.
| | |
|---|---|
| *H01S 3/105* | (2006.01) |
| *G01B 11/02* | (2006.01) |
| *G01B 11/14* | (2006.01) |
| *H01S 5/14* | (2006.01) |
| *H01S 5/183* | (2006.01) |

(Continued)

(52) U.S. Cl.
CPC ............ *H01S 3/105* (2013.01); *G01B 11/02* (2013.01); *G01B 11/14* (2013.01); *H01S 3/1115* (2013.01); *H01S 5/0602* (2013.01); *H01S 5/0687* (2013.01); *H01S 5/14* (2013.01); *H01S 5/183* (2013.01); *H01S 5/02236* (2013.01);

(Continued)

(58) Field of Classification Search
CPC ......... G01B 11/02; G01B 11/14; H01S 3/105; H01S 3/1115; H01S 5/0687; H01S 5/14; H01S 5/183
USPC .................. 356/614–640, 399–401
See application file for complete search history.

(56) References Cited

PUBLICATIONS

Oliver Gerberding, et al., Optomechanical reference accelerometer, Metrologia, 2015, 654-665, 52.

(Continued)

*Primary Examiner* — Tri T Ton
(74) *Attorney, Agent, or Firm* — Office of Chief Counsel for National Institute of Standards and Technology

(57) ABSTRACT

An optomechanical laser includes: a basal member; a mechanical transducer; a laser disposed on the mechanical transducer, the laser being displaced along the displacement axis in response to a displacement of the mechanical transducer relative to the basal member; a mirror disposed on the armature in optical communication with the laser and opposing the laser; the armature disposed on the basal member and rigidly connecting the mirror to the basal member such that the mirror and the armature move in synchrony with the basal member, and the armature provides a substantially constant distance between the basal member and the mirror; and a cavity comprising: the laser; the mirror; and a cavity length between the laser and the mirror that changes in response to displacement of the laser according to the (Continued)

displacement of the mechanical transducer relative to the basal member, the optomechanical laser providing laser light.

20 Claims, 8 Drawing Sheets

(51) Int. Cl.
*H01S 3/11* (2006.01)
*H01S 5/0687* (2006.01)
*H01S 5/06* (2006.01)
*H01S 5/022* (2006.01)
*H01S 5/04* (2006.01)

(52) U.S. Cl.
CPC ........... *H01S 5/02284* (2013.01); *H01S 5/041* (2013.01); *H01S 5/18361* (2013.01)

(56) References Cited

PUBLICATIONS

John Melcher, et al., A self-calibrating optomechanical force sensor with femtonewton resolution, Appl. Phys. Lett., 2014, 233109, 105.
Felipe Guzman Cervantes, et al., High sensitivity optomechanical reference accelerometer over 10 kHz, Applied Physics Letters, 2014, 221111, 104.

OPTOMECHANICAL LASER FOR DYNAMIC MEASUREMENT

CROSS REFERENCE TO RELATED APPLICATIONS

This application claims the benefit of U.S. Provisional Patent Application Ser. No. 62/355,215, filed Jun. 27, 2016, the disclosure of which is incorporated herein by reference in its entirety.

STATEMENT REGARDING FEDERALLY SPONSORED RESEARCH

This invention was made with United States Government support from the National Institute of Standards and Technology, an agency of the United States Department of Commerce. The Government has certain rights in the invention.

BRIEF DESCRIPTION

Disclosed is an optomechanical laser comprising: a basal member; a mechanical transducer disposed on the basal member, the mechanical transducer being moveably displaced along a displacement axis relative to the basal member in response to receipt of a transduction stimulus by the mechanical transducer; a laser disposed on the basal member such that the mechanical transducer is interposed between the laser and the basal member, the laser being displaced along the displacement axis in response to a displacement of the mechanical transducer relative to the basal member; a mirror disposed on an armature in optical communication with the laser and opposing the laser; the armature disposed on the basal member and rigidly connecting the mirror to the basal member such that the mirror and the armature move in synchrony with the basal member, and the armature provides a substantially constant distance between the basal member and the mirror; and a cavity comprising: the laser; the mirror; and a cavity length between the laser and the mirror that changes in response to displacement of the laser according to the displacement of the mechanical transducer relative to the basal member, the optomechanical laser providing laser light in response to subjecting the laser to a pump excitation.

Also disclosed is a process for performing a dynamical length measurement, the process comprising: providing an optomechanical laser; pumping the laser with the pump excitation; producing the laser light; determining a first wavelength of the laser light; and determining a first cavity length of the cavity based on the first wavelength to perform dynamical length measurement of the cavity.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments is presented herein by way of exemplification and not limitation.

It has been discovered that an optomechanical laser herein includes provides transduction from a displacement to an optical frequency. Accordingly, the optomechanical laser provides dynamical determination of a physical observable as the optical frequency.

Figure 1:
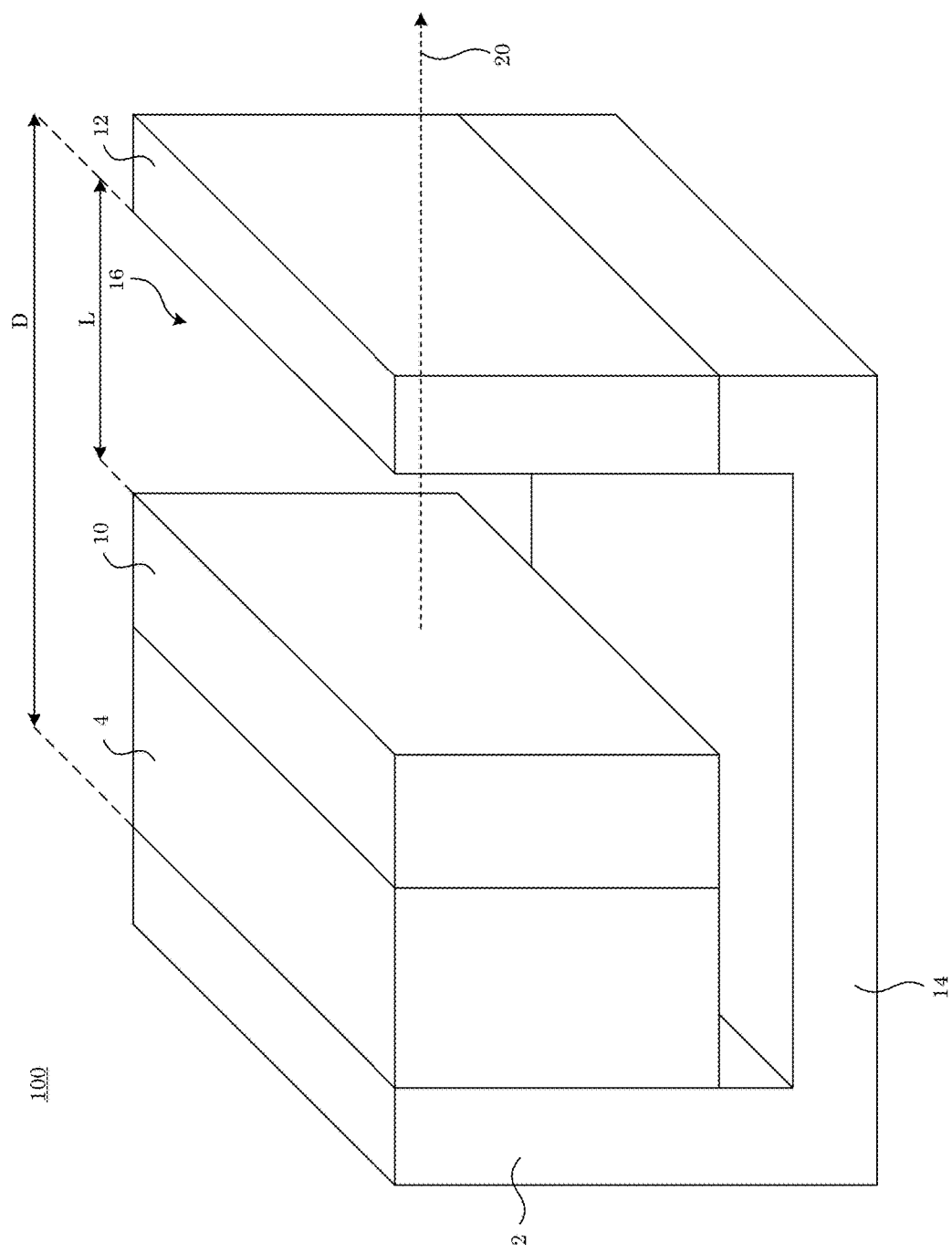
FIG. 1 shows a perspective view of an optomechanical laser.
Figure 2:
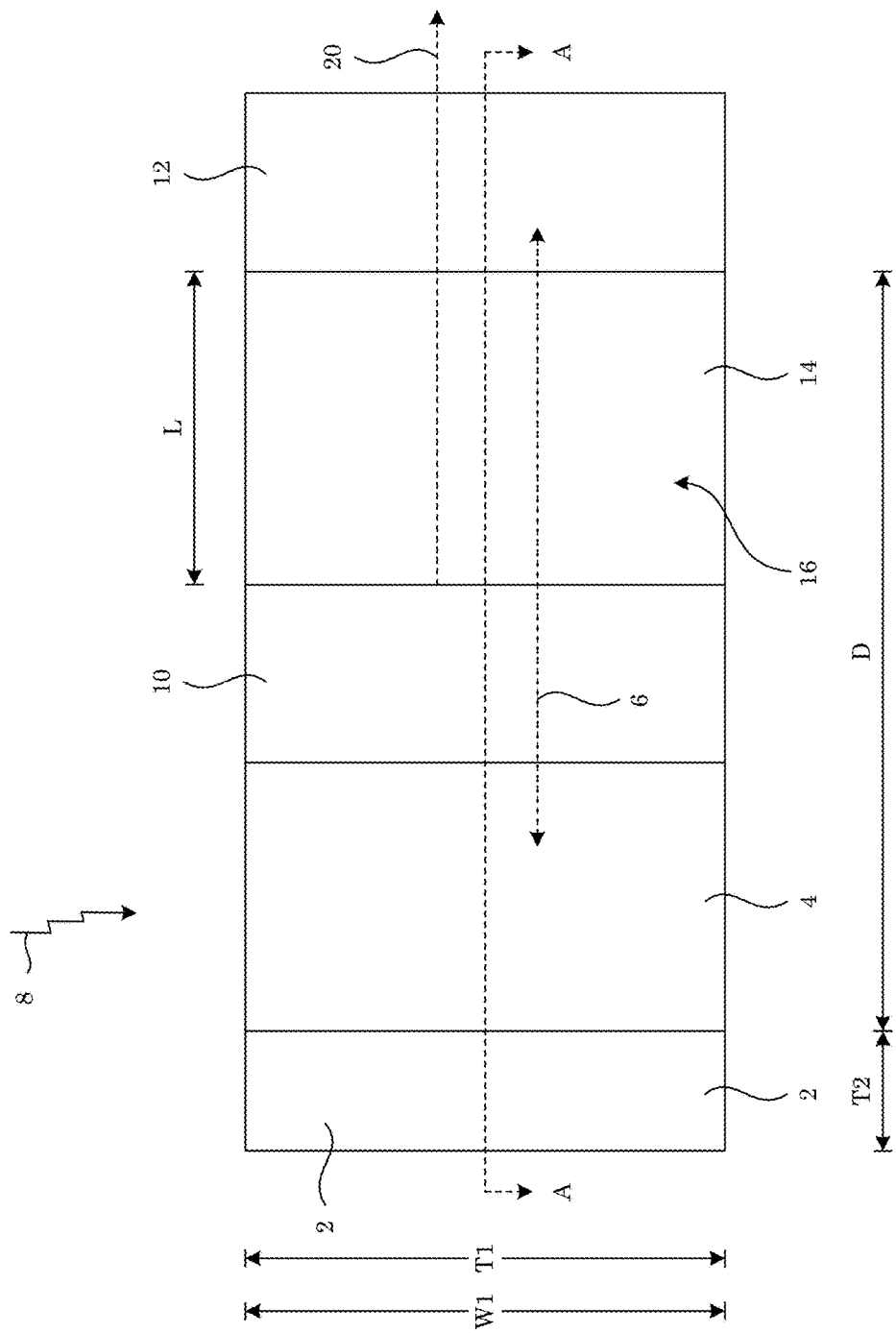
FIG. 2 shows a top view of the optomechanical laser shown in FIG. 1.
Figure 3:
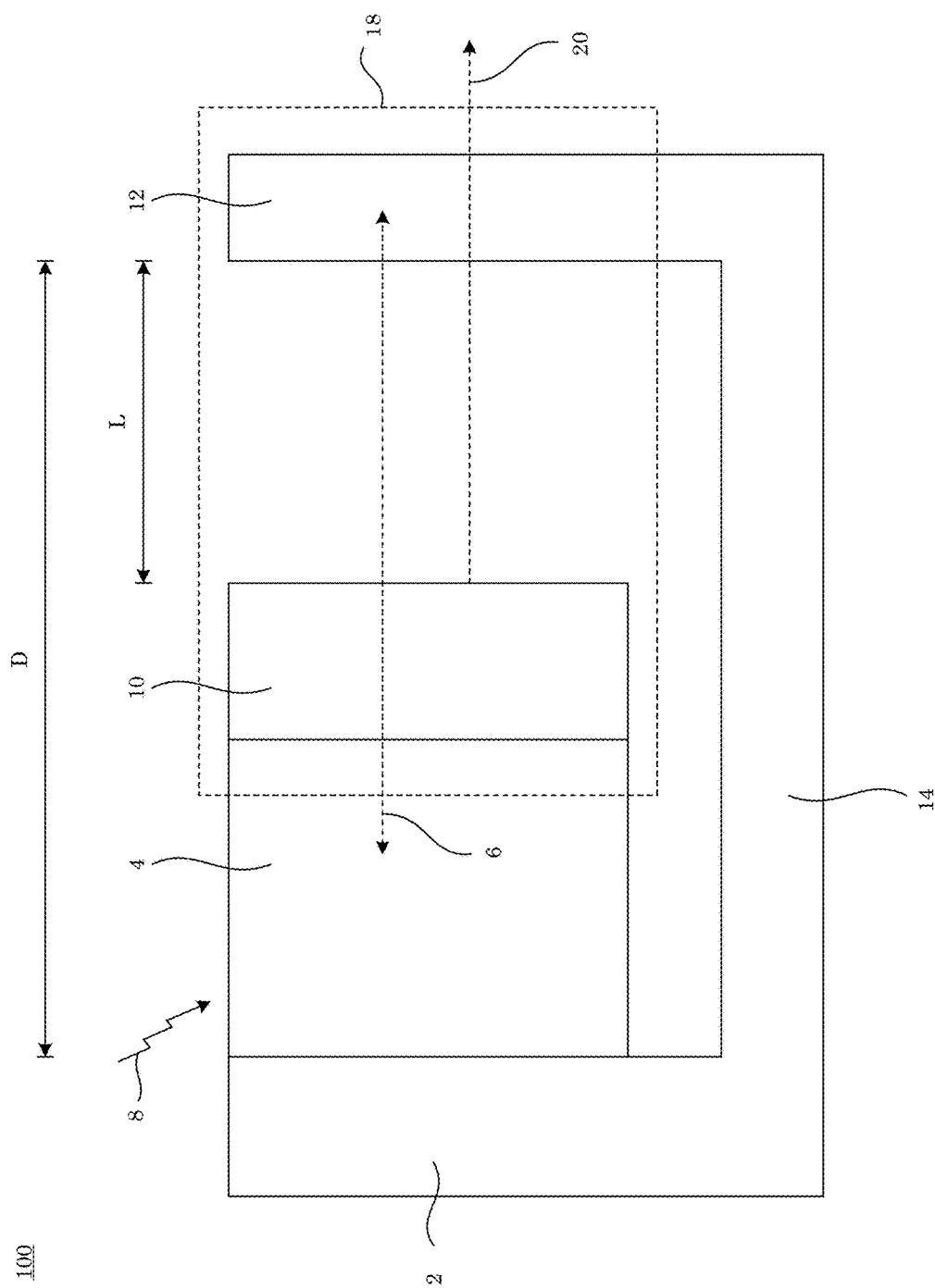
FIG. 3 shows a cross-section along line A-A of the optomechanical laser shown in FIG. 2.

In an embodiment, with reference to FIG. 1, FIG. 2, and FIG. 3, optomechanical laser 100 includes basal member 2; mechanical transducer 4 disposed on basal member 2, mechanical transducer 4 being moveably displaced along displacement axis 6 relative to basal member 2 in response to receipt of transduction stimulus 8 by mechanical transducer 4; laser 10 disposed on basal member 2 such that mechanical transducer 4 is interposed between laser 10 and basal member 2, laser 10 being displaced along displacement axis 6 in response to a displacement of mechanical transducer 4 relative to basal member 2; mirror 12 disposed on armature 14 in optical communication with laser 10 and opposing laser 10; armature 14 disposed on basal member 2 and rigidly connecting mirror 12 to basal member 2 such that mirror 12 and armature 14 move in synchrony with basal member 2, and armature 14 provides a substantially constant distance D between basal member 2 and mirror 12; and cavity 18 including: laser 10; mirror 12; and cavity length L between laser 10 and mirror 12 that changes in response to displacement of laser 10 according to the displacement of mechanical transducer 4 relative to basal member 2, optomechanical laser 100 providing laser light 20 in response to subjecting laser 10 to a pump excitation. It is contemplated that distance D can be from 10 micrometers (μm) to 10 centimeter (cm), specifically from 100 μm to 5 cm, and more specifically from 1 mm to 5 cm.

Figure 4:
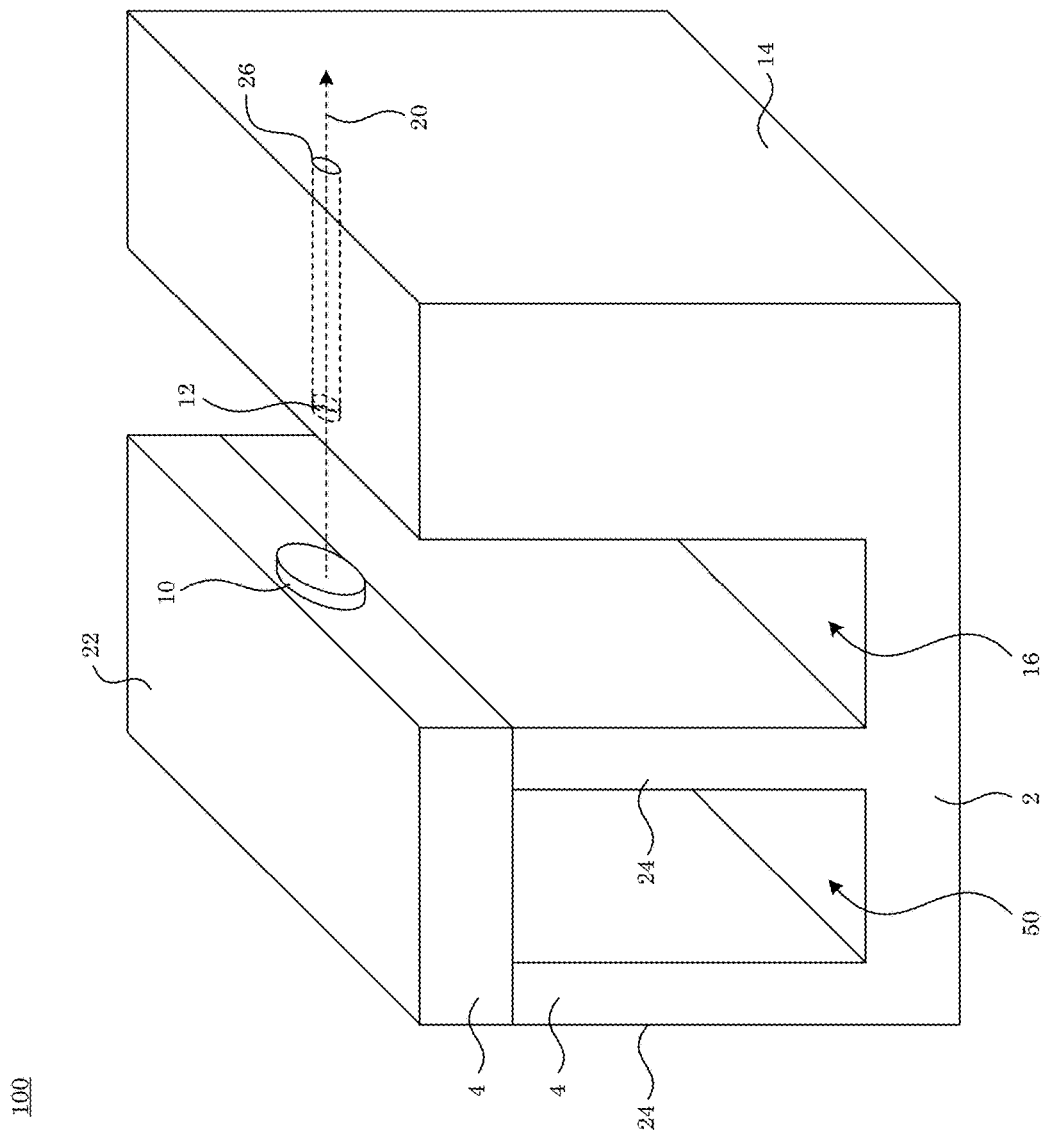
FIG. 4 shows a perspective view of an optomechanical laser.
Figure 5:
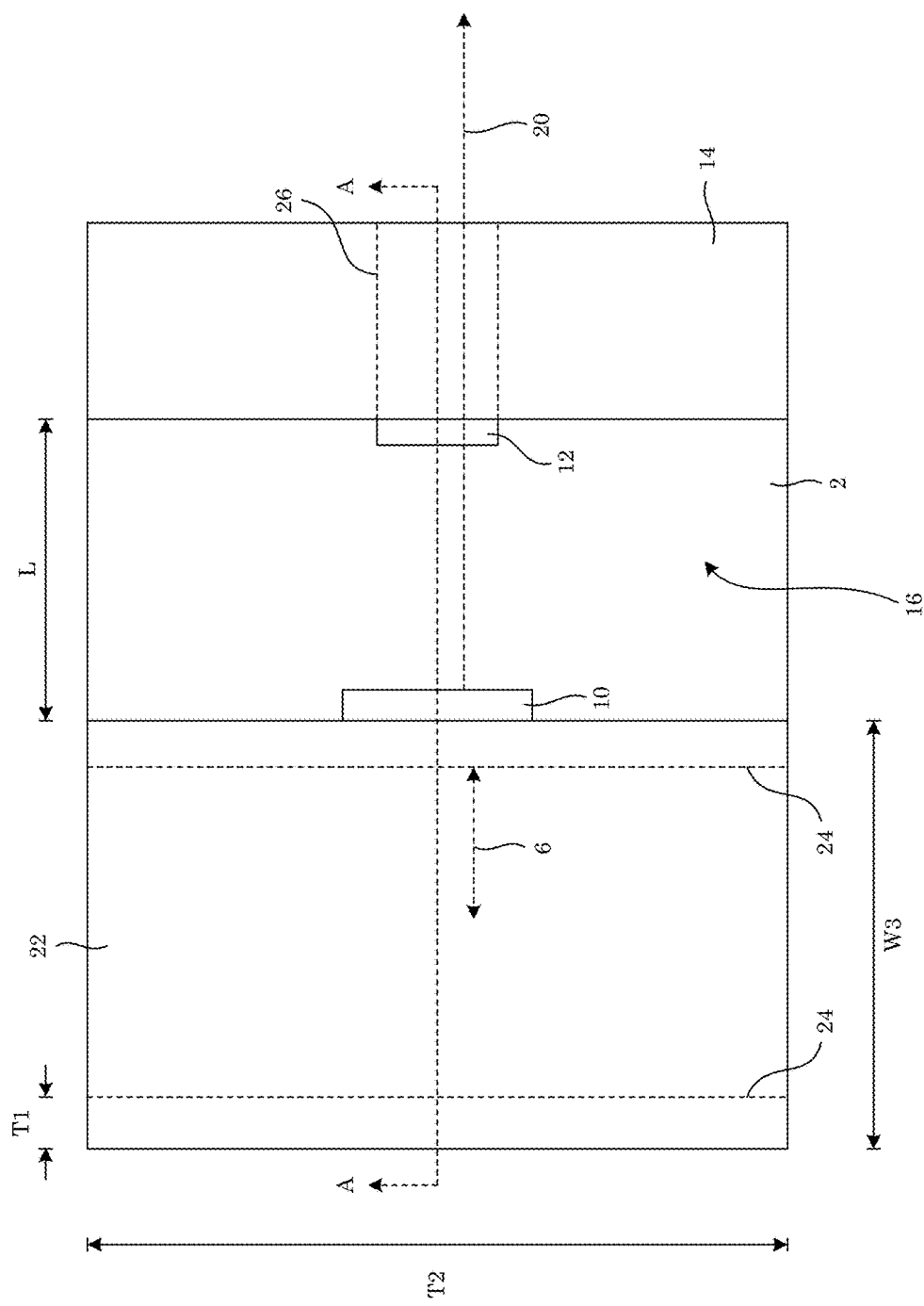
FIG. 5 shows a top view of the optomechanical laser shown in FIG. 4.
Figure 6:
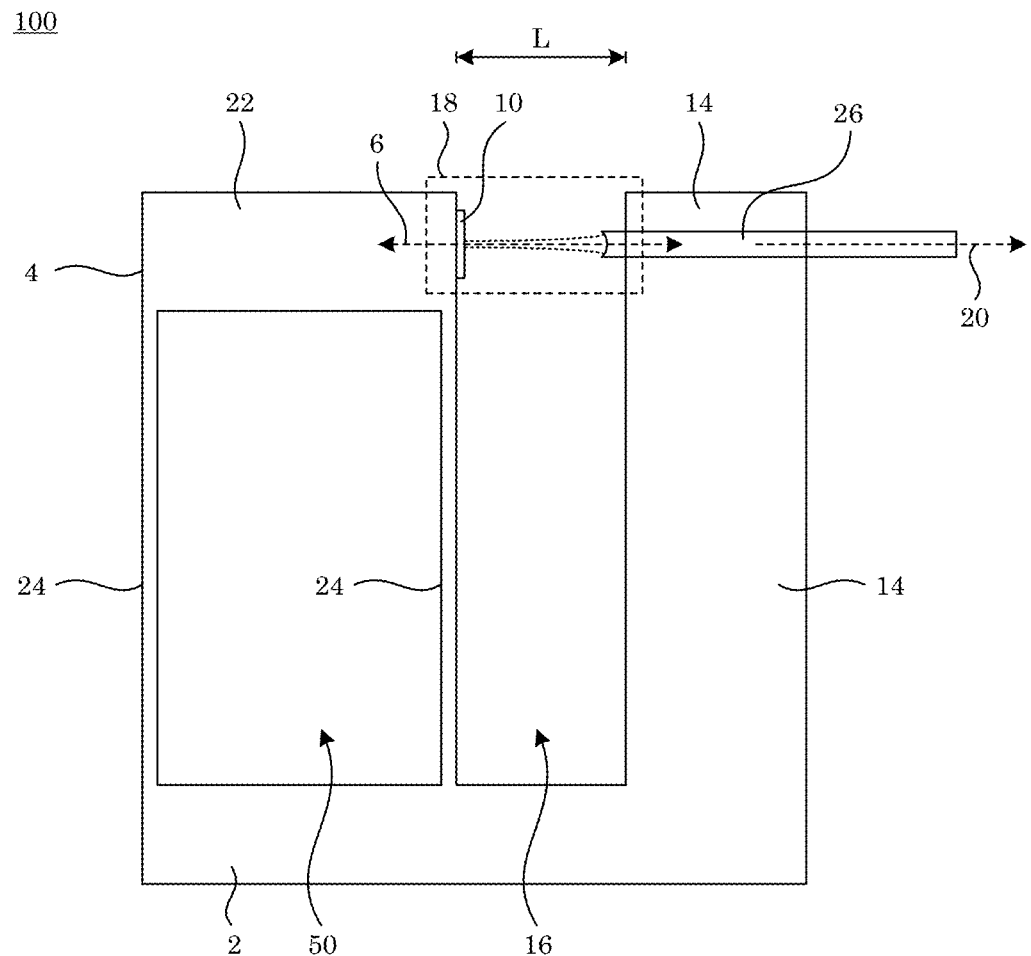
FIG. 6 shows a cross-section along line A-A of the optomechanical laser shown in FIG. 5.

In an embodiment, with reference to FIG. 4, FIG. 5, and FIG. 6, optomechanical laser 100 includes mechanical transducer 4 that includes test mass 22 disposed on basal member 2. Mechanical transducer 4 further can include flexural member 24 interposed between basal member 2 and test mass 22 such that test mass 22 is moveably disposed on basal member 2 via flexing of flexural member 24. Additionally, armature 14 can be disposed opposing test mass 22 and flexural member 24 such that armature 14 is spaced apart from test mass 22, and basal member 2 and armature 14 are subject to identical displacement. Optomechanical laser 100 can include optical coupler 26 in optical communication with mirror 12 and disposed on mirror 12 such that optical coupler 26 communicates laser light 20 from cavity 18. It is contemplated that displacement axis 6 is collinear with test mass 22 and cavity 18, wherein test mass 22 displaced along displacement axis 6 in response to flexing of flexural member 24.

Armature 14 is spaced apart from test mass 22, and basal member 2 and armature 14 are subject to identical displacement (i.e., basal member 2 and armature 14 move in synchrony). Optical coupler 26 is in optical communication with mirror 12 and provides laser light to cavity 18.

Armature 14 and flexural member 24 are spaced apart by gap 16. Similarly, adjacent flexural members 24 are separated by gap 50. Gap 16 can be from 10 μm to 10 cm. Further, cavity length L can be from 10 μm to 10 cm. Gap 50 can be from 100 μm to 1 cm.

Flexural member 24 can be a leaf spring that has an anisotropic aspect ratio with respect to dimensions of its thicknesses. Here, flexural member 24 can have first thickness T1 from 10 μm to 1 mm. Additionally, flexural member 24 can have second thickness T2 from 100 μm to 1 cm.

Dimensions of optomechanical laser 100 can include first width W1 and second width W2 independently from 100 μm to 12 cm. Moreover, test mass 22 can have width W3 from 120 μm to 1.2 cm.

In optomechanical laser 100, test mass 22 provides a mechanical linkage between acceleration or force and position. It is contemplated that test mass 22 can include a material selected for disposition of laser 10 thereon. Exemplary materials for test mass 22 include a metal, polymer, glass, ceramic, semiconductor, metalloid, main group element, non-metal element, an electrical insulator, an electrical conductor, and the like, or a combination thereof. In an embodiment, test mass 22 includes silica. A mass of test mass 22 can be from 1 mg to 100 g.

Figure 8:
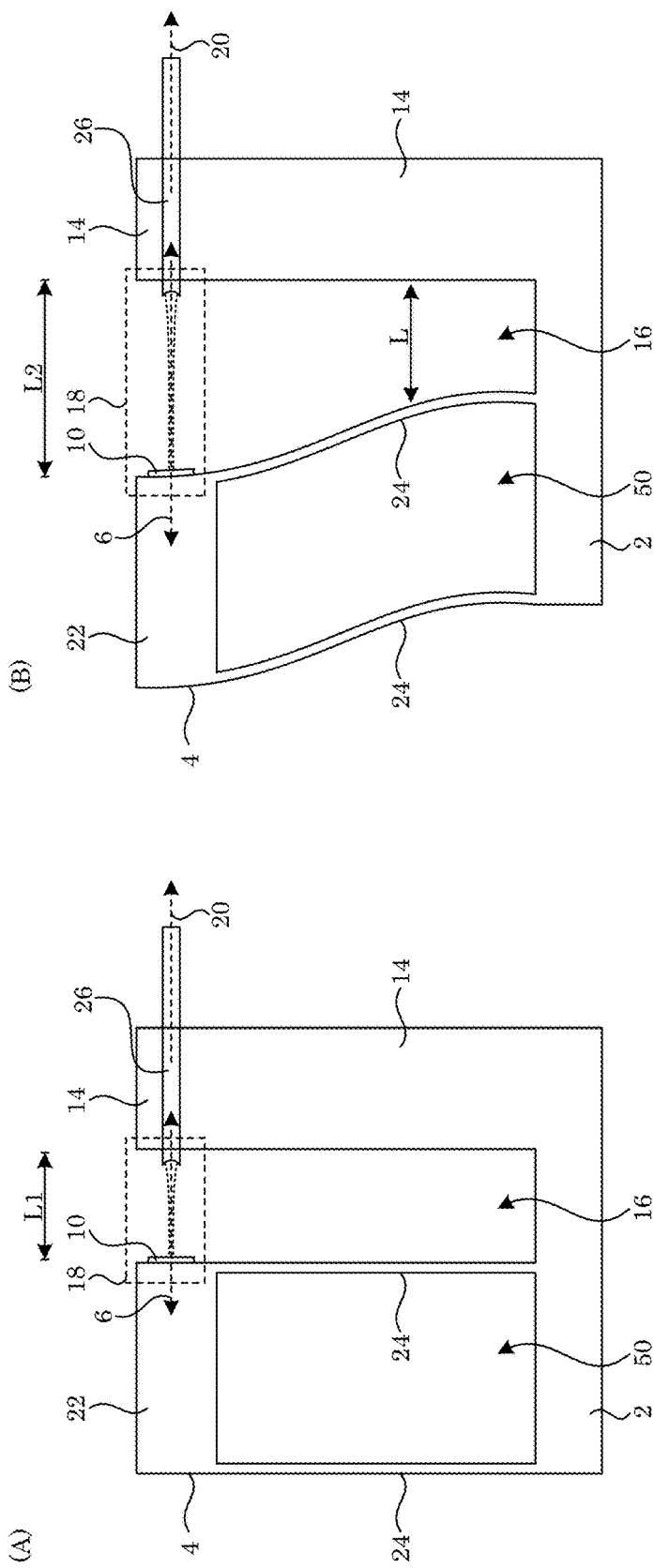
FIG. 8 shows displacement of a test mass and flexing of a flexural member in an optomechanical laser.

In optomechanical laser 100, test mass 22 is disposed on flexural member 24. As shown in FIG. 8, flexural member 24 provides uniaxial response of the test mass position to applied forces. In panel A of FIG. 8, cavity 18 has first cavity length L1 with flexural members 24 at a non-flexed rest position. In panel B of FIG. 8, cavity 18 has second cavity length L2 that is greater than L1 with flexural member 24 at a flexed tension position. It is contemplated that cavity length L can be less than first cavity length L1. In this regard, a length of cavity length L can be from 10 μm to 10 cm.

Flexural member 24 can include a material so that flexural member 24 has a Young's modulus to provide a selected amplitude of displacement of test mass 22 relative to armature 14. The Young's modulus of flexural member 24 can be from 50 to 500 GPa. Exemplary materials for flexural member 24 include a metal, polymer, glass, ceramic, semiconductor, metalloid, main group element, non-metal element, an electrical insulator, an electrical conductor, and the like, or a combination thereof. Flexural member 24 can be a same or different material then that of test mass 22. In an embodiment, flexural member 24 includes silica.

In optomechanical laser 100, test mass 22, flexural member 24, and armature 14 are disposed on basal member 2. Basal member 2 provides mechanical communication between the flexural members and armatures. It is contemplated that basal member 2 can include a material selected for rigidity for attaching mirror 12 and armature 12 to basal member 2. Exemplary materials for basal member 2 include a metal, polymer, glass, ceramic, semiconductor, metalloid, main group element, non-metal element, an electrical insulator, an electrical conductor, and the like, or a combination thereof. In an embodiment, basal member 2 includes silica.

Displacement of test mass 22 along displacement axis 6 changes cavity length L of cavity 18. In optomechanical laser 100, laser 10 provides a gain medium for light sufficient for single mode or mode-locked operation. In an embodiment, laser 10 includes chip-based lasers, diode lasers, but also gas-based gain media. According to an embodiment, laser 10 includes a vertical-external-cavity surface-emitting laser (VECSEL). In a particular embodiment, with reference to FIG. 7, the VECSEL includes a saturable absorber, referred to as a MIXEL. Here, the VECSEL can have a plurality of layers that include, e.g., reflective layers creating a Bragg mirror, quantum well regions providing gain or saturable absorption.

To produce lasing, the pump excitation can include an electronic pump (e.g., by populating the quantum well with electrons and holes), an optical pump (e.g., by creating excitons in the quantum well via an external optical source such as a pump laser), or a combination thereof.

Mirror 12 receives laser light from an external light source and communicates the laser light to the laser 10 as part of cavity 18. In this manner, mirror 12 in combination with laser 10 provides a series of optical resonances and communicates the possibility of lasing in a single transverse mode configuration. It is contemplated that mirror 12 can include a material selected for communication of laser light therethrough. Exemplary materials for mirror 12 include dielectric stacks or metal coatings, and the like, or a combination thereof. In an embodiment, mirror 12 includes a saturable absorber for mode-locked laser operation.

Cavity 18 that includes laser 10 and mirror 12 provides mode selection for lasing and communicates the connect between the length of the cavity and its optical resonance frequencies. In an embodiment, cavity 18 provides mode locked lasing. Here, laser light 20 includes a plurality of optical pulses, and the optical pulses are temporally separated based on cavity length L of cavity 18. A temporal separation of sequential optical pulses can be from 1 picosecond (ps) to 1000 ps. Cavity 18 can have a free spectral range from 1 to 1000 GHz. Accordingly, the wavelength of laser light communicated in cavity 18 can be from 400 to 2000 nanometers, specifically from 800 to 1000 nm.

In an embodiment, laser light 20 is a continuous wave laser light, and a wavelength of laser light 20 is based on cavity length L of cavity 18. The wavelength can be from 400 to 2000 nanometers, specifically from 800 to 1000 nm.

Cavity length 18 changes based upon receipt of transduction stimulus 8 from an external source. Transduction stimulus 8 can include an acceleration, a force, an electric field, a temperature, a pressure, or a combination thereof. In an embodiment, the transduction stimulus is acceleration, and cavity length L changes by ranges of 0.1 nanometer to 1000 nanometers.

In optomechanical laser 100, armature 14 can include a material selected for rigid and essentially constant distance of separation of mirror 12 and basal member 2. Exemplary materials for armature 14 include a metal, polymer, glass, ceramic, semiconductor, metalloid, main group element, non-metal element, an electrical insulator, an electrical conductor, and the like, or a combination thereof. In an embodiment, armature 14 includes silica. Further, the stability of the armature and its communication to the basal member provides a stable arm of the cavity system, preventing accidental transduction of other sources of vibration.

Optomechanical laser 100 has numerous beneficial uses, including performing a dynamical measurement. In an embodiment, a process for performing a dynamical length measurement includes: providing optomechanical laser 100; pumping laser 10 with pump excitation; producing laser light 20; determining a first wavelength of laser light 20; and determining a first cavity length L1 of cavity 18 based on the first wavelength to perform dynamical length measurement of cavity 18.

The process for performing a dynamical length measurement further can include: receiving transduction stimulus 8 by mechanical transducer 4; converting transduction stimulus 8 to displacement of mechanical transducer 4; displacing laser 10 relative to mirror 12 in response to displacement of mechanical transducer 4; changing first cavity length L1 to second cavity length L2 in response to displacing laser 10; changing from the first wavelength to the second wavelength of laser light 20 based on the second cavity length; and determining second cavity length L2 based on the second wavelength of laser light 20.

The process for performing dynamical length measurement can include determining a magnitude of transduction stimulus 8 based on a difference between second cavity length L2 and first cavity length L1. The process also can include: operating optomechanical laser 100 in continuous wave mode, wherein laser light 20 includes a continuous wave such that cavity 18 supports a single mode of laser light 20, and determining the wavelength comprises comparing laser light 20 to an optical reference. In some embodiments, the process further includes: operating optomechanical laser 100 in mode locked mode; and determining a time difference between the plurality of sequential pulses of laser light 20, wherein cavity 18 includes a free spectral range.

In the process, pumping laser 10 with pump excitation includes pumping with an 808 nm diode laser from an oblique angle, or using other electrical or laser sources.

In the process, producing laser light 20 includes inducing sufficient gain in the laser 10 to have cavity lasing.

In the process, In the process, determining a first wavelength of laser light 20 includes referencing the laser wavelength to a spectroscopic standard or to a stable local oscillator.

In the process, determining a first cavity length L1 of cavity 18 based on the first wavelength to perform dynamical length measurement of cavity 18 comparing the observed laser wavelength to a model of the cavity system, which enables extraction of a length after calibration of the cavity.

In the process, receiving transduction stimulus 8 by mechanical transducer 4 includes any method of putting a force on the test mass by an external stimulus.

In the process, converting transduction stimulus 8 to displacement of mechanical transducer 4 includes the conversion of a force on the test mass to a test mass displacement by, e.g., the elastic response of the flexural members.

In the process, displacing laser 10 relative to mirror 12 in response to displacement of mechanical transducer 4 includes the motion of the laser-mirror distance by the motion of the test mass.

In the process, changing from the first wavelength to the second wavelength of laser light 20 based on the second cavity length includes the adiabatic response of the laser system to changing length conditions, which allows for laser wavelength following the cavity length.

In the process, determining second cavity length L2 based on the second wavelength of laser light 20 includes comparing the laser wavelength to a spectroscopic standard or a stable local oscillator.

In the process, determining a magnitude of transduction stimulus 8 based on a difference between second cavity length L2 and first cavity length L1 includes differencing the spectroscopic signals in software or hardware.

In the process, operating optomechanical laser 100 in continuous wave mode includes operating the pumping to sufficient levels to enable lasing.

In the process, determining the wavelength comprises comparing laser light 20 to an optical reference includes shining the generated light on a spectrometer or heterodyne detection by comparison to a stable local oscillator, i.e., another laser.

In the process, operating optomechanical laser 100 in mode locked mode includes operating the pump with its intensity temporally modulated near the FSR frequency and/or driving laser 20 to sufficient intensity to initiate mode locking via the saturable absorber suppression of unwanted superpositions of modes.

In the process, determining a time difference between the plurality of sequential pulses of laser light 20 includes monitoring the intensity of light leaving the cavity as a function of time and converting this varying signal into an estimate of the spacing between peaks of signal via optical or electronic means.

Optomechanical laser 100 has numerous advantageous and beneficial properties. In an aspect, optomechanical laser 100 provides the opportunity to operate an oscillator whose frequency is determined by the signal transduced, following prior concepts such as the ring laser gyroscope.

The articles and processes herein are illustrated further by the following Example, which is non-limiting.

Example

Optomechanical laser for dynamic measurements.

Figure 7:
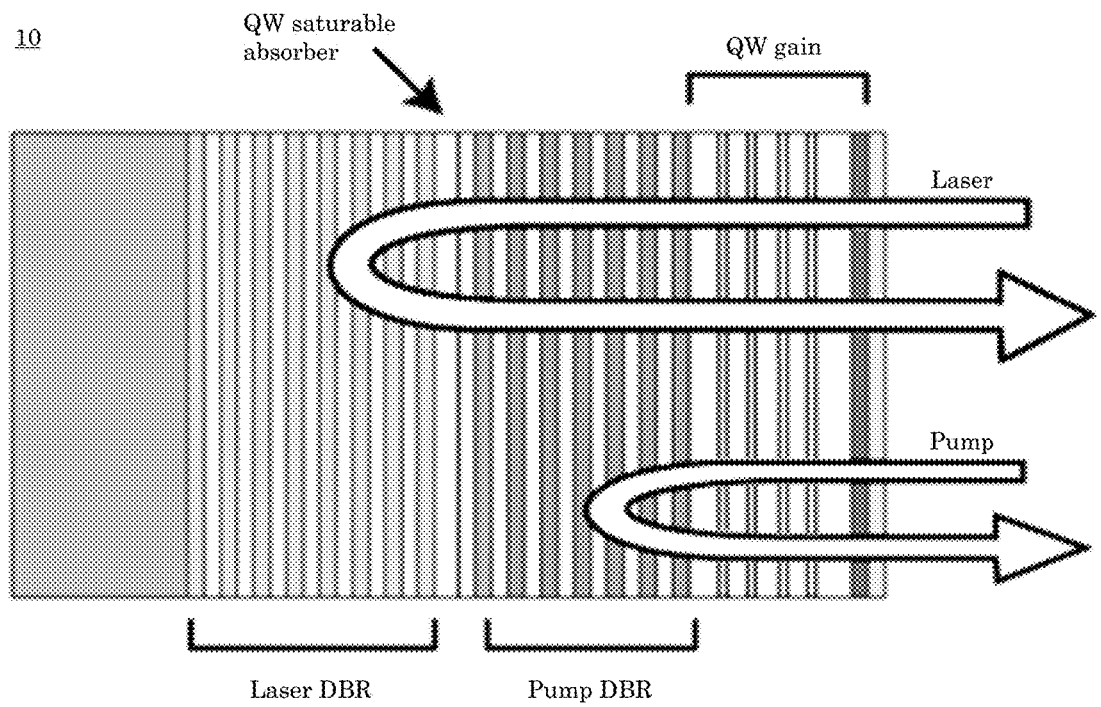
FIG. 7 shows a laser.

The optomechanical laser includes a semiconductor light-emitting chip and an external high reflectivity mirror, together constituting an external cavity laser which is embedded in low-loss mechanical oscillator. Displacements of the oscillator's test mass, which change the external cavity length, will translate directly into variations of the lasing wavelength or frequency. Thus, this optomechanical laser is effectively a displacement-to-frequency transducer. The optomechanical laser is shown in A schematic of the proposed device is shown, e.g., FIG. 6 in which an integrated VECSEL can be pumped either optically or electrically. FIG. 7 shows a semiconductor structure used as a gain mirror with integrated saturable absorber. Locations of the chip and the mirror can be interchanged, depending on the pumping mechanism, electrical or optical, and considerations on the mechanical structure.

The VECSEL can be operated as a single-mode laser, emitting light at only one frequency, or as a mode-locked laser that emits light pulses with a regular time interval, or repetition rate $\tau$, that is inversely proportional to the free spectral range (FSR) of the laser cavity; hence $$FSR = \frac{1}{\tau} = \frac{c}{2L},$$

where c is the speed of light. The nominal lasing frequency of the order of 300 THz is determined by the design of the quantum wells in the device, whereas finer adjustments are determined by the VECSEL cavity length. Thus, changes in the cavity length will translate as shifts in the laser frequency.

With regard to single-mode laser operation, the absolute frequency of the laser will shift with the cavity length according to $$\Delta v = \frac{c}{\lambda} \frac{\Delta L}{L},$$

where $\lambda$ is the lasing wavelength. In this case, an optical reference in involved to down-convert the nominal optomechanical laser frequency of 1014 Hz to a practical value that can be measured with commercially available detectors and electronics.

With regard to mode-locked laser operation, mode-locking of the VECSEL is achieved by using a semiconductor saturable absorber in the laser cavity. When the pump power is switched on, the unsaturated gain is greater than the cavity losses and the oscillating optical field inside the cavity increases rapidly showing very strong fluctuations. As the power increases, the intensity of the strongest mode starts to saturate the absorbing medium, suffering smaller losses and eliminating the other competing modes. The losses of the absorber and the gain of the amplifying medium are modulated by the circulating pulse itself, allowing a passive mode-locking at the repetition rate τ. Since this modulation frequency is equal to the frequency separation between the modes, namely the FSR, the longitudinal modes contained in the spectrum will be coupled to each other and will synchronize to have constant phase differences, as coupled oscillators.

The mode-locked laser pulses will interfere emitting a beat-note at a frequency equal to the cavity FSR, which is significantly lower than the nominal laser frequency, and can be designed to be measurable with commercially available detectors and electronics. In such a system, test mass displacements will translate to FSR changes as $$\Delta FSR = \frac{c}{2L^2} \Delta L. \quad (1)$$

While shorter cavities result in more sensitive measurements of the displacement ΔL due to larger frequency shifts Δν, cavities equal or larger than 3 mm, which are still very compact, yield FSRs below 50 GHz, conveniently entering the realm of proven and commercially available technology in photodetectors and microwave frequency references. The effect of internal and external perturbations will be common to all longitudinal modes and they will shift simultaneously, keeping their frequency spacing identical unless the laser cavity length changes. This relative measurement would then be extremely sensitive and much more robust to harsh environments than a standard absolute frequency measurement, and also significantly less sensitive to systematics and instrument noise.

The VECSEL can be pumped optically or electrically. Performance between these two approaches may vary in resolution, stability, and power consumption. Moreover, design of the device can consider mechanical oscillator and its interface to the chip. Trade-offs between cavity lengths and stiffness of the oscillator can be made to define the measurement resolution and dynamic range, as well as the choice in materials to account for thermal effects in the chip, and the overall device stability. The optimal cavity length, however, is far from obvious, since as the length increases, the mechanical stability decreases, wherein a long cavity can include deviations due to temperature fluctuations, even in a low CTE material, like fused silica. Furthermore, it becomes increasingly difficult to provide isolated, single mechanical vibration mode since other modes of vibration can occur within the frame itself.

This sensor leverages large scale manufacturing in the semiconductor industry. The device provides dynamic displacement sensing with high accuracy and long-term stability.

Cavity length variations of the optomechanical laser will proportionally change the lasing frequency to provide a displacement-to-frequency transducer.

A mode-locked optomechanical laser to provide beat note of interfering longitudinal modes is at GHz frequencies, measurable with photodetectors and corresponding electronics. The frequency signal is a direct measurement of the optomechanical cavity length.

A single-mode optomechanical laser produces a signal at optical frequencies in the order of 1014 Hz. Fluctuations around the mean frequency are proportional to the cavity length and be detected by using an external reference laser to down-convert the signal to measurable frequencies; using a detector to measure optical frequencies, such as wavelength meter, optical spectrum analyzer, spectrometer, a scanning Fabry-Pérot or Fizeau interferometer, and alike.

The optomechanical laser can be a fixed-frequency or tunable Terahertz source that includes a short cavity length.

The optomechanical laser can be used for dynamic metrology of physical quantities such as acceleration, force, pressure, temperature, refractive index, and the like.

Considerations for the configuration of the optomechanical laser can include design of the mechanical oscillator and transduction of a physical observable to a displacement measured by the optomechanical laser.

The optomechanical laser can be for remote sensing, such as laser ranging and spectroscopy.

A mode-locked optomechanical laser can be used to measure long distances, as in laser ranging applications and space-based inter-satellite distance measurements and communications such as currently planned space-based gravitational-wave observatories or multi-satellite geodesy missions. This can be done by knowing or measuring the original optomechanical cavity FSR (mode beat frequency) and measuring the resulting beat frequency note at the receiving end. Changes in the beat note frequency resulting from the Doppler shift correspond to the distance rate changes between emitting and receiving ends.

The VECSEL can emit high optical power in the range of tens of Watts while maintaining low intensity and frequency noise, resulting in a compact size suitable for space missions in gravitational physics such as LISA and GRACE missions.

The VECSEL can include a semiconductor gain medium disposed on a Bragg mirror (active mirror) and an external dielectric mirror, resulting in a laser system when properly aligned and pumped. The nominal lasing frequency of the order of 300 THz is determined by the design of the quantum wells in the chip, whereas finer adjustments in its absolute value are determined by the VECSEL cavity length. Thus, changes in the cavity length will translate as shifts in the laser frequency. Typically, this is considered undesired laser frequency noise, however, when built on an oscillating structure, this feature of the VECSEL will translate test mass displacements directly into detectable laser frequency changes.

The optomechanical laser can be used for acceleration sensing by translating the accelerometer test mass displacement directly into measureable laser frequency changes.

The optical spectrum of a micro-cavity laser is sensitive to cavity length variations. The absolute frequency of the laser will shift with the cavity length according to $$\Delta \nu = \frac{c}{\lambda} \frac{\Delta L}{L},$$

where c is the speed of light, L is the cavity length and λ the lasing wavelength. While shorter cavities result in more sensitive measurements of the displacement ΔL due to larger frequency shifts Δν, cavities equal or larger than 3 mm yield FSRs below 50 GHz, conveniently entering the realm of proven and commercially available technology in photodetectors and microwave frequency references.

Changes of the optical frequency can be measured by using a second reference laser to generate a measurable beatnote, which can be used for verification. Another method is to convert the frequency modulations into amplitude modulations using a Fabry-Perrot interferometer or a gas cell.

Instead, we operate the optomechanical laser in a multimode condition, such that a beatnote between adjacent longitudinal modes generates a signal at measureable frequencies. While this approach yields a highly compact and self-contained portable device, its sensitivity and resolution may be limited by the number of longitudinal modes contained in the optical spectrum, and by the phase fluctuations between them. However, it is possible to lock the phase of these longitudinal modes with a passive mode locking technique, and refer the displacement measurement to the frequency difference between longitudinal modes (FSR). The effect of internal and external perturbations will be common to all longitudinal modes and they will shift simultaneously, keeping their frequency spacing identical unless the laser cavity length itself changes. This relative measurement would then be extremely sensitive and much more robust to harsh environments than a standard absolute frequency measurement, and also significantly less sensitive to systematics and instrument noise that have been observed in our previous work.

As mentioned above, VECSELs can be optically and electrically pumped. Performance between these two approaches may vary in resolution, stability, and power consumption. These two kinds of mode-locked optomechanical lasers can be used for acceleration sensing. Moreover, to use the optomechanical laser as an accelerometer, trade-offs between cavity length and stiffness of the oscillator can be considered to provide the measurable acceleration resolution and dynamic range, as well as the choice in materials to account for thermal effects in the chip, and overall device stability.

Acceleration resolution is related to thermal fluctuations of the test mass, which are given for a simple harmonic oscillator at high temperature by $$a_{th}[\omega] = \sqrt{\frac{4 k_B T \omega_0}{mQ}}, \qquad (2)$$

where m is the test-mass, Q is the mechanical quality factor, T is the temperature of the test-mass thermal bath, kB is the Boltzmann's constant, and $\omega_0$ is the natural frequency of the mechanical oscillator. Typically, acceleration is obtained from a direct displacement measurement, and both observables are related by the following transfer function:

$$\frac{X[\omega]}{A[\omega]} = \frac{1}{\omega_0^2 - \omega^2 - i\frac{\omega_0}{Q}\omega}. \qquad (3)$$

The interface of the harmonic oscillator to its supporting structure is a key element that will strongly affect the mechanical quality factor Q. Recently, we have demonstrated acceleration sensors of very high sensitivity that incorporate a fiber-optic Fabry-Pérot micro-cavity as optical displacement sensor, nonetheless, encountering technical limitations in the long-term performance of the DC readout of these devices due to laser and fiber noise.

In the optomechanical laser, a laser is disposed on the test mass (a mechanical oscillator) such that displacements of the accelerometer test mass translate into frequency shifts of the laser. A direct frequency readout is significantly less sensitive to systematics previously observed, and is also much more accurate and robust. In such a system, test mass displacements will translate to laser frequency changes as $$\Delta \nu = \frac{c}{\lambda} \frac{\Delta L}{L}, \qquad (4)$$

where c is the speed of light, L is the nominal cavity length, λ is the nominal lasing wavelength, and Δν are the laser frequency changes resulting from the test mass displacement ΔL.

Assuming $\omega_0=2\pi 10,000$, m=25 mg, and Q=104-105, and combined with an optomechanical laser with L=3 mm, λ=1020 nm, mode frequency separations occur near 50 GHz, and a frequency resolution of is 24 Hz, resulting in a frequency measurement with a relative uncertainty of 5×10-10.

While one or more embodiments have been shown and described, modifications and substitutions may be made thereto without departing from the spirit and scope of the invention. Accordingly, it is to be understood that the present invention has been described by way of illustrations and not limitation. Embodiments herein can be used independently or can be combined.

Reference throughout this specification to "one embodiment," "particular embodiment," "certain embodiment," "an embodiment," or the like means that a particular feature, structure, or characteristic described in connection with the embodiment is included in at least one embodiment. Thus, appearances of these phrases (e.g., "in one embodiment" or "in an embodiment") throughout this specification are not necessarily all referring to the same embodiment, but may. Furthermore, particular features, structures, or characteristics may be combined in any suitable manner, as would be apparent to one of ordinary skill in the art from this disclosure, in one or more embodiments.

All ranges disclosed herein are inclusive of the endpoints, and the endpoints are independently combinable with each other. The ranges are continuous and thus contain every value and subset thereof in the range. Unless otherwise stated or contextually inapplicable, all percentages, when expressing a quantity, are weight percentages. The suffix "(s)" as used herein is intended to include both the singular and the plural of the term that it modifies, thereby including at least one of that term (e.g., the colorant(s) includes at least one colorants). "Optional" or "optionally" means that the subsequently described event or circumstance can or cannot occur, and that the description includes instances where the event occurs and instances where it does not. As used herein, "combination" is inclusive of blends, mixtures, alloys, reaction products, and the like.

As used herein, "a combination thereof" refers to a combination comprising at least one of the named constituents, components, compounds, or elements, optionally together with one or more of the same class of constituents, components, compounds, or elements.

All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." Further, the conjunction "or" is used to link objects of a list or alternatives and is not disjunctive; rather the elements can be used separately or can be combined together under appropriate circumstances. It should further be noted that the terms "first," "second," "primary," "secondary," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

What is claimed is:

1. An optomechanical laser comprising:
a basal member;
a mechanical transducer disposed on the basal member, the mechanical transducer being moveably displaced along a displacement axis relative to the basal member in response to receipt of a transduction stimulus by the mechanical transducer;
a laser disposed on the basal member such that the mechanical transducer is interposed between the laser and the basal member, the laser being displaced along the displacement axis in response to a displacement of the mechanical transducer relative to the basal member;
a mirror disposed on an armature in optical communication with the laser and opposing the laser;
the armature disposed on the basal member and rigidly connecting the mirror to the basal member such that the mirror and the armature move in synchrony with the basal member, and the armature provides a substantially constant distance between the basal member and the mirror; and
a cavity comprising:
the laser;
the mirror; and
a cavity length between the laser and the mirror that changes in response to displacement of the laser according to the displacement of the mechanical transducer relative to the basal member,
the optomechanical laser providing laser light in response to subjecting the laser to a pump excitation.

2. The optomechanical laser of claim 1, wherein the mechanical transducer comprises a test mass disposed on the basal member.

3. The optomechanical laser of claim 2, wherein the mechanical transducer further comprises a flexural member interposed between the basal member and the test mass such that the test mass is moveably disposed on the basal member via flexing of the flexural member.

4. The optomechanical laser of claim 3, wherein the flexural member comprises a leaf spring.

5. The optomechanical laser of claim 3, wherein the armature is disposed opposing the test mass and the flexural member such that:
the armature is spaced apart from the test mass, and
the basal member and the armature are subject to identical displacement.

6. The optomechanical laser of claim 5, further comprising:
an optical coupler in optical communication with the mirror and disposed on the mirror such that the optical coupler communicates the laser light from the cavity.

7. The optomechanical laser of claim 6, wherein the displacement axis is collinear with the test mass and the cavity, the test mass being displaced along the displacement axis in response to flexing of the flexural member.

8. The optomechanical laser of claim 1, wherein the laser comprises a vertical-external-cavity surface-emitting laser (VECSEL).

9. The optomechanical laser of claim 8, wherein the VECSEL comprises a saturable absorber.

10. The optomechanical laser of claim 8, wherein the mirror comprises a saturable absorber.

11. The optomechanical laser of claim 1, wherein the cavity provides mode locked lasing.

12. The optomechanical laser of claim 11, wherein the laser light comprises a plurality of optical pulses, and
the optical pulses are temporally separated based on the cavity length of the cavity.

13. The optomechanical laser of claim 1, wherein the laser light comprises continuous wave laser light, and
a wavelength of the laser light is based on the cavity length of the cavity.

14. The optomechanical laser of claim 1, wherein the pump excitation comprises an electronic pump, and optical pump, or a combination comprising at least one of the foregoing.

15. The optomechanical laser of claim 1, wherein transduction stimulus comprises an acceleration, a force, an electric field, a temperature, a pressure, or a combination comprising at least one of the foregoing transduction stimuli.

16. A process for performing a dynamical length measurement, the process comprising:
providing an optomechanical laser of claim 1;
pumping the laser with the pump excitation;
producing the laser light;
determining a first wavelength of the laser light; and
determining a first cavity length of the cavity based on the first wavelength to perform dynamical length measurement of the cavity.

17. The process of claim 16, further comprising
receiving the transduction stimulus by the mechanical transducer;
converting the transduction stimulus to displacement of the mechanical transducer;
displacing the laser relative to the mirror in response to displacement of the mechanical transducer;
changing the first cavity length to a second cavity length in response to displacing the laser;
changing from the first wavelength to the second wavelength of the laser light based on the second cavity length; and
determining the second cavity length based on the second wavelength of the laser light.

18. The process of claim 17, further comprising determining a magnitude of the transduction stimulus based on a difference between the second cavity length and the first cavity length.

19. The process of claim 17, further comprising:
operating the optomechanical laser in continuous wave mode,
wherein the laser light comprises a continuous wave,
the cavity supports a single mode of the laser light, and
determining the wavelength comprises comparing the laser light to an optical reference.

20. The process of claim 17, further comprising:
operating the optomechanical laser in mode locked mode; and
determining a time difference between a plurality of sequential pulses of the laser light,
wherein the cavity comprises a free spectral range.

* * * * *